United States Patent
Noell

(10) Patent No.: US 8,390,269 B2
(45) Date of Patent: Mar. 5, 2013

(54) NON-DESTRUCTIVE DETERMINATION OF FUNCTIONALITY OF AN UNKNOWN SEMICONDUCTOR DEVICE

(75) Inventor: Matthew S. Noell, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 338 days.

(21) Appl. No.: 12/899,980

(22) Filed: Oct. 7, 2010

(65) Prior Publication Data

US 2012/0086432 A1 Apr. 12, 2012

(51) Int. Cl.
 G01R 31/00 (2006.01)
(52) U.S. Cl. .......................................... 324/96
(58) Field of Classification Search .................. None
 See application file for complete search history.

(56) References Cited

U.S. PATENT DOCUMENTS

| | | | |
|---|---|---|---|
| 6,496,022 B1 | 12/2002 | Kash et al. | |
| 6,798,234 B2 * | 9/2004 | Laackmann et al. | 326/21 |
| 2005/0161748 A1 * | 7/2005 | Chow et al. | 257/409 |
| 2011/0314445 A1 * | 12/2011 | Dutta et al. | 717/109 |
| 2012/0048327 A1 * | 3/2012 | Gore | 324/76.11 |

OTHER PUBLICATIONS

R. Torrance and D. James, Reverse Engineering in the Semiconductor Industry, IEEE 2007 Custom Intergrated Circuits Conference, 2007, 429-436.
D. Burns and J. Kendall, Imaging Latch-Up Sites in LSI CMOS with a Laser Photoscanner, 1983, 118-120, IEEE/ IRPS.

* cited by examiner

*Primary Examiner* — Jermele M Hollington
(74) *Attorney, Agent, or Firm* — Pierce Atwood LLP; Joseph M. Maraia

(57) ABSTRACT

Processes and systems for use in reverse engineering integrated circuits determine functionality through analysis of junctions responding to external radiation. Semiconductor devices include a number of p-n junctions grouped according to interconnected functional cells. A surface of the semiconductor device is illuminated by radiation, e.g., by a laser or an electron beam, producing electron-hole pairs. Such pairs give rise to detectable currents that can be used to determine locations of irradiated junctions. By scanning a surface of the device in such a manner, a layout of at least some of the junctions can be obtained. The layout can be used to identify functional cells according to a lookup process. By selectively providing input test vectors to the device and repeating the scanning process, first level functional cells can be identified. A netlist of interconnected functional cells can thus be determined and expanded by repeating the process with different test vectors.

17 Claims, 7 Drawing Sheets

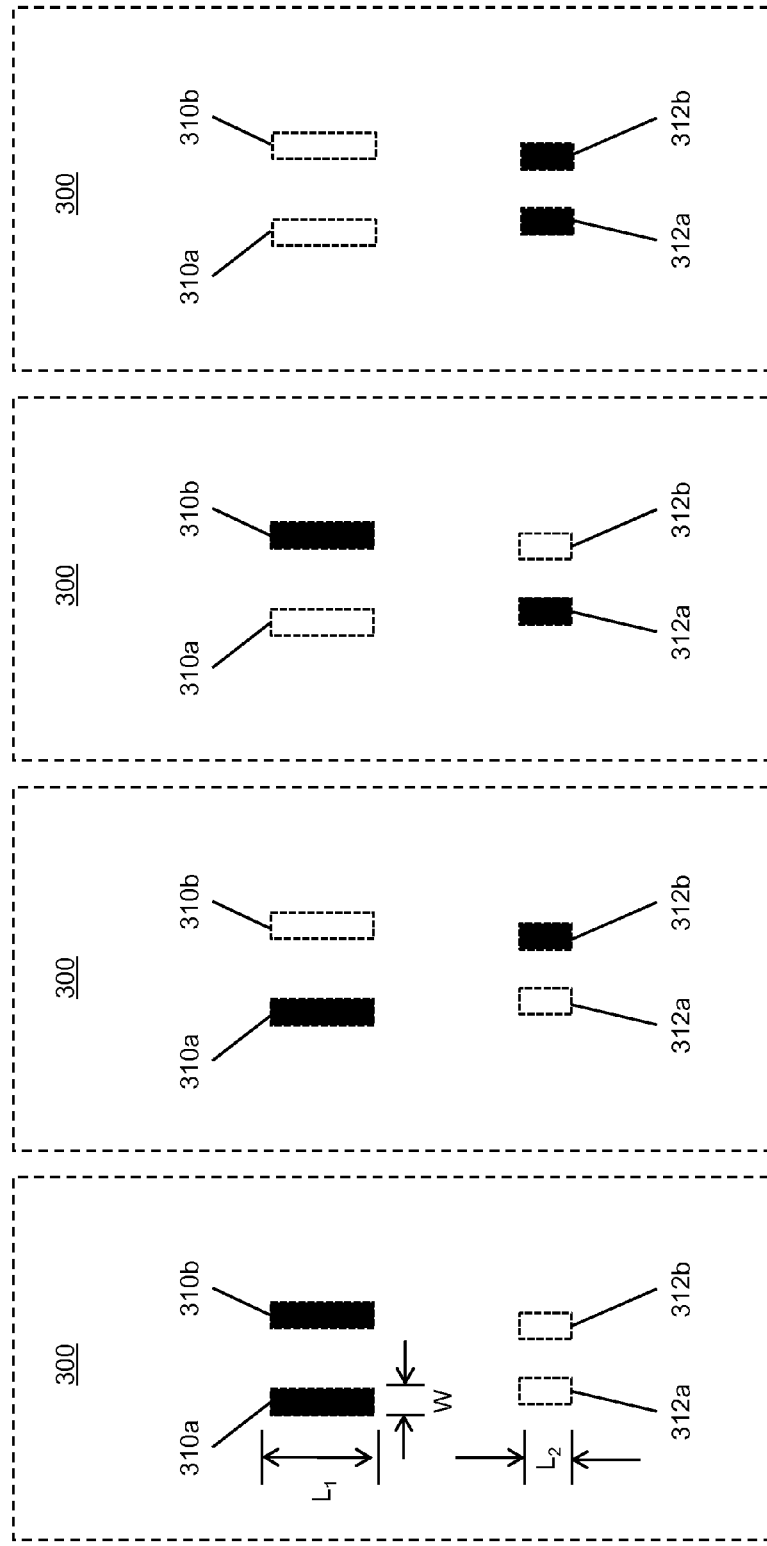

NON-DESTRUCTIVE DETERMINATION OF FUNCTIONALITY OF AN UNKNOWN SEMICONDUCTOR DEVICE

TECHNICAL FIELD

Various embodiments are described herein relating generally to reverse engineering of integrated circuits and the like, and more particularly to non-destructive reverse engineering of integrated circuits by inferring functionality through analysis of junction response to external radiation.

BACKGROUND

Reverse engineering is the process of discovering the technological principles of a device, object or system through analysis of its structure, function and operation. The process often involves taking something (e.g., a mechanical device, electronic component, or software program) apart and analyzing its workings in detail. Reverse engineering is commonly applied to semiconductor integrated circuits to uncover their inner workings. At least one motivation for such an undertaking is to determine whether a competitor's product contains patent infringements or copyright infringements. Another reason is to confirm whether the fabrication of a particular integrated circuit conforms to the underlying design—did the fabrication facility "get it right."

Semiconductor devices are complex, ranging from 1.0-micron single metal bipolar chips, through 0.35-micron BiCMOS—DiffusedMOS (BCDMOS) chips, to 65-nm, 12-metal microprocessors, and everything in between. Both aluminum and copper can be used for metal on the same chip. Depending on the process generation, the polysilicon gates and the source/drains can use different silicides. A variety of low-K dielectrics can be interspersed with fluorosilicate glass (FSG), phospho-silicate glass (PSG), and SiO2. Layer thicknesses vary greatly. Presently, such devices can have up to 12 layers of metal, and use an esoteric combination of materials to create both the conductors and dielectrics. They may have hundreds of millions of logic gates, plus huge analog, RF, memory, and other macro-cell areas. MEMs, inductors, and other devices are also being integrated on-chip.

Reverse engineering of such devices is typically an invasive and destructive process. Each layer of a multilayer device is removed, for example, by grinding. Images (e.g., pictures) of each layer are taken, for example, by an electron microscope. The inner workings of the semiconductor device can be obtained using such a technique, but not without a significant investment in effort and special equipment. For example, at least one problem for such an investigator is to bring everything into the right order to find out how everything works.

Reverse engineering of semiconductor-based products can broadly take several forms, including (i) system level analysis—analyzing operations and signal paths, and (ii) interconnections, and circuit extraction—typically accomplished by de-layering to transistor level, then extracting interconnections and components to create schematics.

During package removal, packages are etched off in a corrosive acid solution. A variety of acids at various temperatures are used depending on the composition and size of the particular package. These solutions dissolve away the packaging material, but do not damage the die. Hermetic and ceramic packages require different techniques that usually involve mechanical or thermal treatment to remove lids, or dice from substrates, or even polish away a ceramic substrate.

A de-layering lab needs to create a single sample of the semiconductor device at each metal layer, and at the polysilicon transistor gate level. As such, it needs to accurately strip off each layer, one at a time, while keeping the surface planar. This requires detailed recipes for removal of each layer. These recipes include a combination of methods such as plasma (dry) etching, wet etching, and polishing. As the complexity and variation of chips increases, so too does the number of recipes.

Full circuit extraction requires taking note of all transistors, capacitors, diodes, and other components, all interconnect layers, and all contacts and vias. This can be done manually or using automation. Full circuit extraction means taking note of all transistors, all contacts/vias between levels, and all interconnects at each level, and then condensing them to a schematic readable by a design engineer. Typically a block of circuitry is extracted at a time, and then cross-referenced so that a full schematic is available, if required. Unfortunately, such approaches are costly, complicated and destructive.

SUMMARY

Described herein are embodiments of systems and techniques for non-destructive reverse engineering of integrated circuits by inferring functionality through analysis of junction response to external radiation. In particular, the semiconductor devices remain operational during and after completion of the process.

In one aspect, at least one embodiment described herein supports a process for use in determining functionality of a semiconductor device including a number of semiconductor junctions in electrical communication with at least one power supply, the semiconductor junctions grouped into a number of interconnected functional cells, and the device also including a number of externally accessible contacts in electrical communication with at least some of the of semiconductor junctions. The process including: irradiating a surface of the semiconductor device. A layout of at least some of the plurality of semiconductor junctions is determined responsive to the irradiation. Groupings of at least some of the number of semiconductor junctions are identified within the determined layout, each grouping indicative of a respective functional cell. A stimulus to at least one of the number of externally accessible contacts is changed. Connectivity of one or more of the number of interconnected functional cells is inferred in response to the changed stimulus.

In another aspect, at least one embodiment described herein relates to a computer program product, tangibly embodied in an information carrier for use in determining functionality of a semiconductor. The computer program product includes instructions operable to cause a semiconductor device tester to determine a layout of at least some of a number of semiconductor junctions of a semiconductor device responsive to changes in at least one of a voltage and a current of a power supply interconnected to the number of semiconductor junctions. In particular, the changes are responsive to irradiation of a surface of the semiconductor device. The instructions further identify within the determined layout, groupings of at least some of the number of semiconductor junctions. Each grouping is indicative of a respective functional cell of a plurality of predetermined functional cells. A stimulus to at least one of a number of externally accessible contacts of the semiconductor device is changed. At least some of the number of externally accessible contacts is in electrical communication with one or more of the predetermined functional cells. The instructions further infer connectivity of one or more of the number of interconnected functional cells in response to the changed stimulus.

In yet another aspect, at least one embodiment described herein supports a system for use in determining functionality of a semiconductor device. The system includes means for irradiating a surface of the semiconductor device. The semiconductor device, itself, includes a number of semiconductor junctions in electrical communication with at least one power supply and a number of externally accessible contacts in electrical communication with at least some of the number of semiconductor junctions. The semiconductor junctions are grouped into a number of interconnected functional cells. The system also includes means for determining a layout of at least some of the plurality of semiconductor junctions responsive to the irradiation. Means for identifying within the determined layout, groupings of at least some of the plurality of semiconductor junctions are also provided. Generally, each grouping of semiconductor junctions is indicative of a respective functional cell of a plurality of predetermined functional cells. The system further includes means for changing a stimulus to at least one of the plurality of externally accessible contacts, and means for inferring connectivity of one or more of the plurality of interconnected functional cells in response to the changed stimulus.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 4A through FIG. 4D illustrate respective junction layout images for the functional cell illustrated in FIG. 3A and FIG. 3B, under different stimuli.

DETAILED DESCRIPTION

Described herein are embodiments of systems and techniques for non-destructive reverse engineering of integrated circuits by inferring functionality through analysis of junction response to external radiation. An electrically intact semiconductor device is irradiated by an external source capable of inducing electron-hole pairs within junctions of the semiconductor. Such electron-hole pairs stimulated within a suitably biased junction are driven by an internal electric field resulting in an observable electric current. Such currents can be observed through fluctuations in the current or voltage of a power supply interconnected to the device. Preferably, the irradiated region is sufficiently small to differentiate the smallest individual junctions anticipated in a given device. Irradiation sources include electron beams capable of inducing junction currents in a technique referred to as electron beam induced current (EBIC). Similarly, irradiation sources include electromagnetic radiation, such as optical (e.g., laser) sources also capable of inducing junction currents in a technique referred to as optical beam induced current (OBIC).

The irradiated region can be moved with respect to a surface of the semiconductor device, such that detection of a junction through such variation in power supply current can be associated with a location (e.g., x-y coordinates) on the semiconductor device. In at least some embodiments, such movement includes a rasterized scanning of at least a portion of the device surface. In some embodiments, locations of detected junctions can be used to generate an image suggestive of a transistor-level layout of the semiconductor device. Since at least some classes of semiconductor devices are developed using standardized functional cells, it is possible that identification of such cells can be inferred from junction layouts according to a standard cell library.

Figure 1:
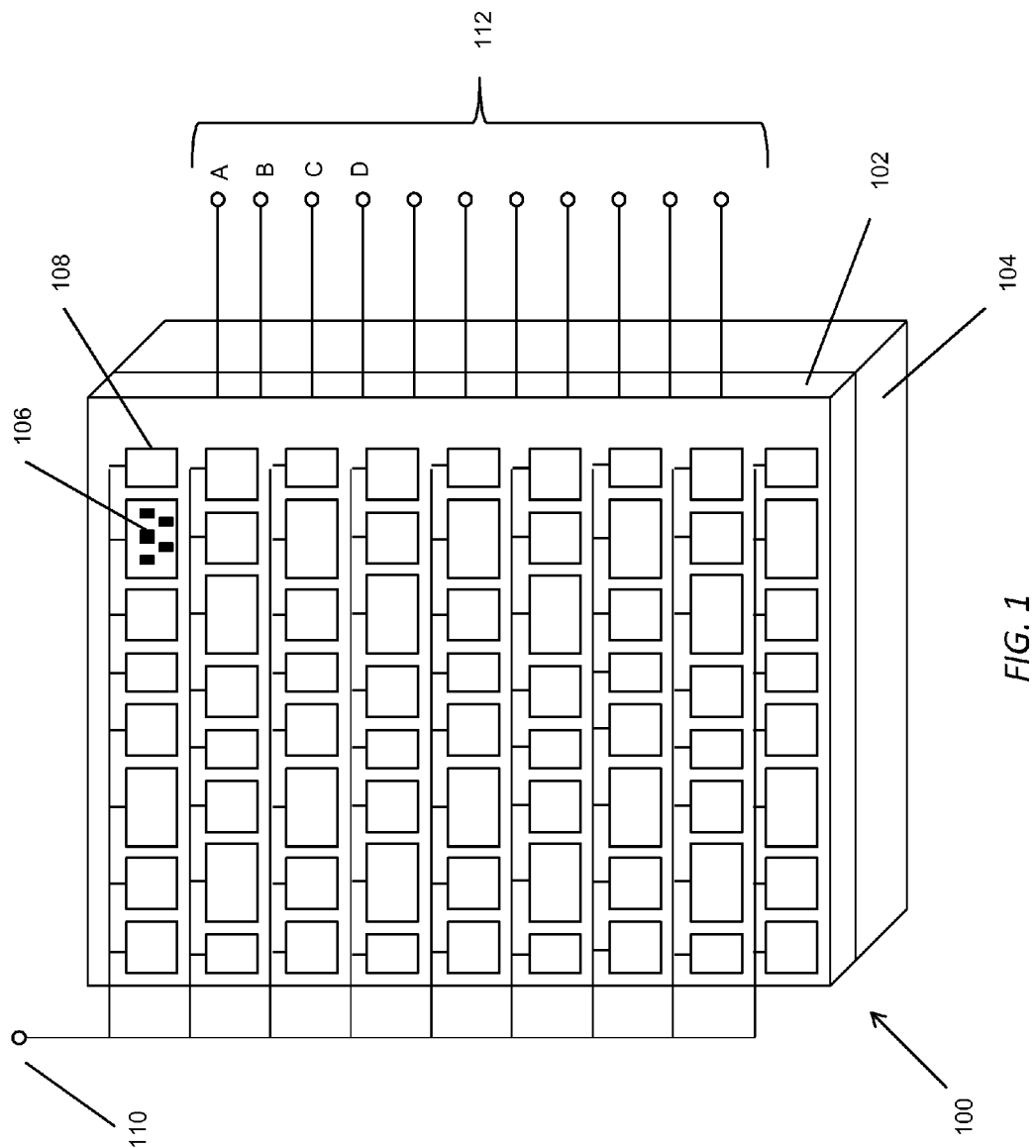
FIG. 1 illustrates a simplified schematic diagram of an example of a semiconductor device.

FIG. 1 illustrates a simplified schematic diagram of an example of a semiconductor device 100. The device 100 includes one or more device and/or interconnect layers 102 disposed upon a supporting layer 104. For example, in silicon devices, the supporting layer can be a layer of silicon, about 150 microns thick. A multitude of semiconductor junctions 106 (i.e., p-n) are disposed across the device 100. The junctions 106 can be junctions of transistor devices, such as gates of field-effect transistors, such as metal-oxide-semiconductor (MOS) transistor devices. At least some of the junctions 106 are configured into functional cells 108. With such groupings, a multitude of such functional cells 108 can be disposed across the supporting layer 104. As illustrated, the functional cells 108 (namely, the junctions of such cells) are interconnected to one or more power supply terminals 110. Also shown is an example arrangement of externally accessible contacts 112. The contacts may represent input/output pins of the device 100 and/or internal test points, for example, included by designers to facilitate testing of the device. Particular routing of such externally accessible contacts 112, such power supply interconnects, and gate-to-gate routing can be accomplished through combinations of electrically conducting wire traces and vias defined in the one or more device and/or interconnect layers 102.

The examples provided herein illustrate digital CMOS technologies. The examples are by no way meant to limit application of the techniques described herein to only these technologies. Similar techniques can be applied to any semiconductor technology having a suitable (e.g., standard) cell library and for which the images obtained by such techniques (e.g., EBIC and OBIC) reflect changes based on bias conditions of inputs to the cells. Preferably, with any such semiconductor technology, layout differences of each functional cell of the related library of cells are distinguishable by the EBIC/OBIC techniques.

As used herein, the phrase "standard cell" or "functional cell" includes a group of transistor and interconnect structures that provides a Boolean logic function (e.g., AND, OR, XOR, XNOR, inverters) or a storage function (e.g., flip-flop or latch). The simplest cells are direct representations of the elemental NAND, NOR, and XOR Boolean function, although cells of much greater complexity are commonly used (such as a 2-bit full-adder, or muxed D-input flip-flop). The cell's Boolean logic function is called its logical view. Functional behavior can be captured in the form of a truth table or Boolean algebra equation (for combinational logic), or a state transition table (for sequential logic).

As used herein, the phrase "standard cell library" or "functional cell library" includes a collection of low-level logic functions such as AND, OR, INVERT, flip-flops, latches, and buffers. These cells are commonly realized as fixed-height, variable-width full-custom cells. A key aspect with these libraries is that they are of a fixed height, which enables them to be placed in rows, easing the process of automated digital layout. Such features also facilitate determination of appropriate groupings of junctions and consequently boundaries of their related functional cells 108. A 2-input NAND or NOR function is sufficient to form any arbitrary Boolean function set. But in modern ASIC design, standard-cell methodology is practiced with a sizable library (or libraries) of cells. The library may contain multiple implementations of the same logic function, differing in area and speed.

The bias of particular junctions of the device will depend, at least to some extent, upon external stimuli applied to externally accessible contacts of the device. Such stimuli can include voltage levels indicative of logic levels (e.g., +5V for a logical "1" and 0V for a logical "0"). Such an array of input values across the multiple inputs can be referred to as a test vector. Different test vectors can be applied at different times as will be described in more detail below.

After having identified the functional cells of a semiconductor device by the techniques described herein, it is possible to infer interconnectivity of such cells in response to external stimuli. Namely, a test vector is applied to the device, the junctions scanned to determine which junctions are suitably biased in response to the test vector. The results can be compared to the logical view of the identified standard cells. The stimulus can be changed by applying a subsequent, different test vector, e.g., which inputs and outputs are at "1" or "0" states. The junctions can be scanned again to determine bias changes in responsive to the changed stimuli. For example, by selectively choosing test vector stimuli, it is possible to determine first-level functional cells, in electrical communication with one or more of the externally accessible contacts. Having inferred such interconnectivity, a netlist can be developed, tracking interconnections of the devices of the functional cells.

As used herein, the phrase "transistor netlist" includes a transistor level design of a standard cell—a nodal description of transistors, of their connections to each other, and of their terminals (ports) to the external environment. A net refers to a description of an electrical circuit interconnecting gates of one or more devices to each other, and in some instances to externally accessible contacts, test points, and the like. As used herein, the phrase "layout view" includes a physical representation of the standard cell—organized into base layers, which correspond to the different structures of the transistor devices, and interconnect lines, which join together the terminals of the transistor formations. As used herein, the term "netlist" without the qualification "transistor", generally includes a standard-cell representation of the ASIC design, at a logical view level, consisting of instances of the standard-cell library gates, and port connectivity between gates.

It is important to recognize that functionality of the semiconductor device is accomplished while the device is functioning. Namely, the device is suitably powered and provided with external stimuli, for example, in the form of test vectors at the device input contacts. The scanning processes described herein relies on the device being operational in a normal sense, such that the transistor junctions, or gates, of the device respond as intended to the external stimuli. Had any layers of the device including interconnects (i.e., wires), vias, and/or devices been removed, it is unlikely that the normal functionality relied upon as described herein, would be possible.

Figure 2:
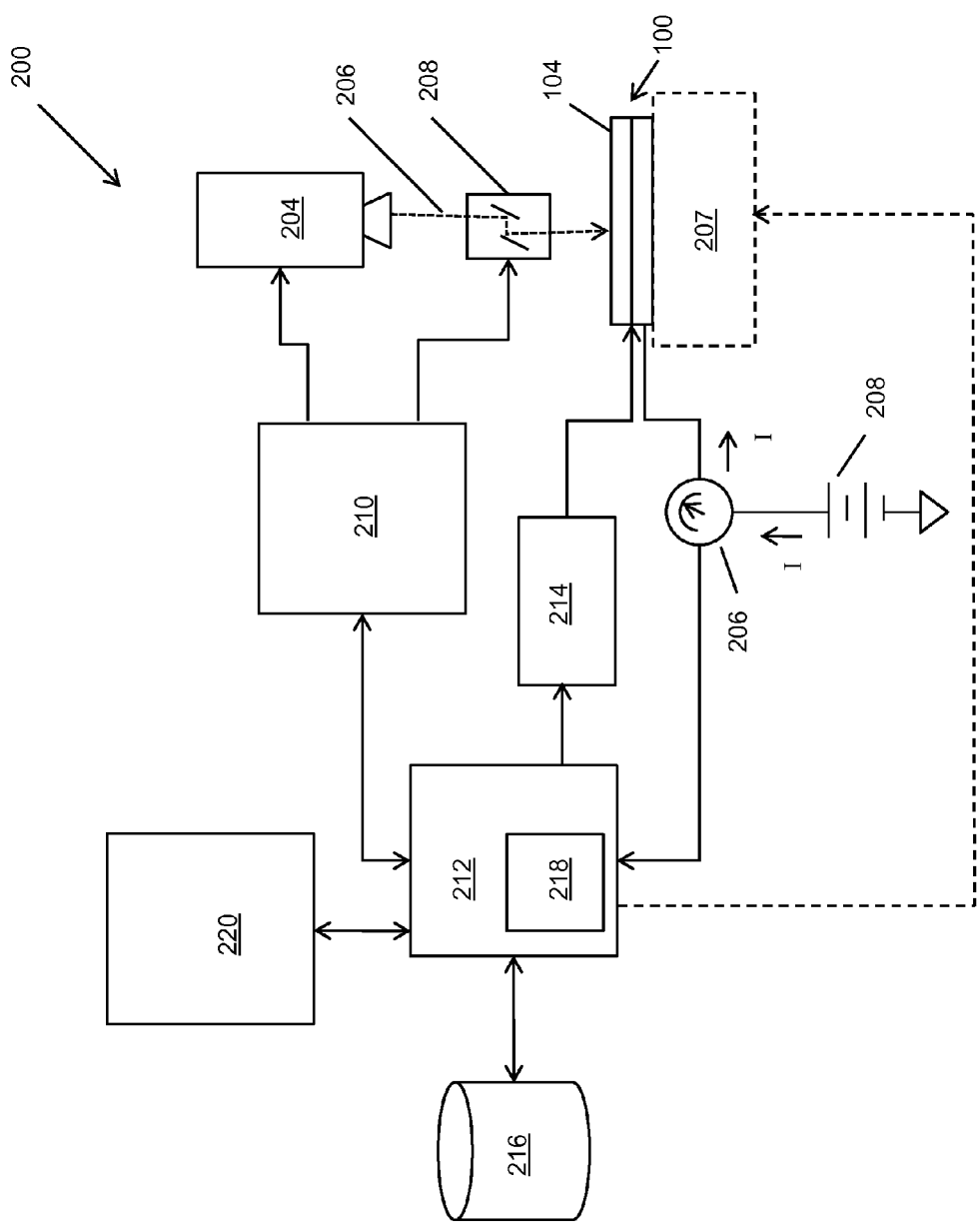
FIG. 2 illustrates a schematic diagram of an example of one type of semiconductor device test system.

FIG. 2 illustrates a schematic diagram of an example of one type of semiconductor device test system 200. The system 200 includes a radiation source 204 generating a beam of radiation directed toward a surface of the semiconductor device 100. In at least some embodiments, the beam of radiation is directed or otherwise steered by a beam directing device 208. Such beam directing devices 208 can include positionable reflectors adapted to reflect the beam of radiation according to their relative position(s) with respect to the beam 206 and the device 100. Alternatively or in addition, one or more of the radiation source 204 and the semiconductor device under analysis can be positionable with respect to each other. For example, the radiation source 204 can be mounted in a gimbal configured for steering the source 204, itself. Likewise, the system 200 may include a chuck 207 supporting the device under analysis 100. The chuck can be positionable, for example, providing x-y displacements of the device under analysis 100. The system 200 includes a radiation source controller 210 in communication with one or more of the radiation source 204, the beam directing device 208, and the chuck 207.

High-density VLSI semiconductor devices include extremely small internal features, e.g., sub-micron in some instances. Such scale requires special consideration. For example, 50-nm transistor gate lengths are well beyond the resolution of optical microscopes. Accordingly, electron microscopes are often necessary just to see the transistors. TEM (transmission electron microscopy) looks through the sample to give high resolution images of the device structure; SCM (scanning capacitance microscopy) is a way of seeing the positive and negative doping that makes up the actual working transistors, resistors, and so on in the silicon chip.

When an electron beam, such as a scanning electron microscope (SEM), strikes a semiconductor sample, it will generate electron-hole pairs within the beam's interaction volume. If the sample contains a p-n junction or a Shottkey junction, electron-hole pairs generated within or near the junction's field may be separated. The field will drift electrons to the n-side, and holes to the p-side. The p- and n-sides can be connected to respective power supply or ground and through a pico-ammeter or current amplifier and the separated electrons and holes will flow through the circuit, producing an electron beam induced current (EBIC):

The size of chips, and the large magnifications required for the advanced feature sizes, requires precise positioning of the EBIC source and the device. For example, systems having automated steppers combined with the irradiation source. Two-dimensional (e.g., x-y) steppers can be used. A plan-view imaging gives limited process information showing the gate of transistor (T1), and the gate of reset transistor (T2) and the gate of source follower transistors (T3), comprising the circuit of a functional or standard cell (see FIG. 3B).

The electrical states of normally operating n- and p-type MOS transistors in some devices, such as CMOS devices, can be determined using an especially configured system. One such system includes a He—Ne laser spot scannable in a raster pattern on the semiconductor device, for example, using a standard metallurgical microscope and commercially available galvanometer mirror scanners. The scanning beam generates hole-electron pairs in a volume about two microns in radius and less than five microns deep. Both dimensions depend on laser wavelength. Carriers generated within about a diffusion length of reverse biased wells or drain junctions are collected and appear as changes in device power supply current.

The device 100 is interconnected to at least one power supply 108, providing power to the junctions 106 (FIG. 1) of the functional cells 108 (FIG. 1) of the device 100. A metering device 209 is positioned to monitor one or more of a current I or voltage V drawn by the device 100. For example, an ammeter (e.g., a pico-ammeter) is connected inline between the device and the power supply to detect minute variations in the electrical current I drawn by the device 100. A central processor 212 is in communication with one or more of the radiation source controller 210, the pico-ammeter 209, and the positionable chuck 207, when provided. In at least some embodiments, the central processor 212 includes or otherwise accesses a memory configured with encoded instructions adapted to implement the functionality described herein. For example, the central processor 212 can be configured by the software code to scan the radiation 206 across a surface of the device under analysis 100, to record any variations in device current, and to record or otherwise associate x-y positions of the scanned beam 206 with respect to the surface of the device 100 associated with each such current variation.

In at least some embodiments, the system 200 includes a test stimulator 214 configured to provide selectable inputs (e.g., test vectors) to one or more of the electrically accessible contacts 112 (FIG. 1). In some embodiments, the test stimulator 214 is controllable by the central processor 212. Alternatively or in addition, the test stimulator 214 can represent a separate device that may be pre-programmed to apply a preferred sequence of test vectors to the device under analysis 100.

Commercially available test support systems can be used to facilitate generation of test vectors. The CADENCE® ENCOUNTER® CONFORMAL® equivalence checker, commercially available from Cadence Design Systems, Inc., of San Jose, Calif., is a formal verification tool available as part of the ENCOUNTER system. The formal proof engine creates counter-cases (i.e., test vectors) using mathematical methods rather than exhaustive simulation. Other tools that are built around a formal proof engine in someway could also be used in a similar approach. It would also be possible to apply such tools in such analyses using availability of internals, such as already defined nets. The CONFORMAL system may not be a test vector generating system, but it can be used like one. The formal proof engine creates counter-cases that can be used as test vectors.

The system also includes a database 216 of standard cells. The database 216 can be stored locally, or accessible from a separate system. In at least some examples, the database 216 is accessible over a network, such as the Internet. The system also includes a user interface 220 providing an interactive console for an operator to setup, monitor, and post-process results of analysis of the semiconductor device 100.

Functional analysis includes system monitoring during functional operation. A semiconductor device can be instrumented with probes wherever needed. In some instances, micro-probing can be used to monitor on-chip signals. Test cases must be developed, and the stimulus created for operating the system in its functional modes. Signal generators, logic analyzers, and oscilloscopes can be used to drive the system and collect the results. The signals, and full system, are then analyzed. Of course, any such instrumentation should be implemented in a non-destructive manner.

Figure 3B:
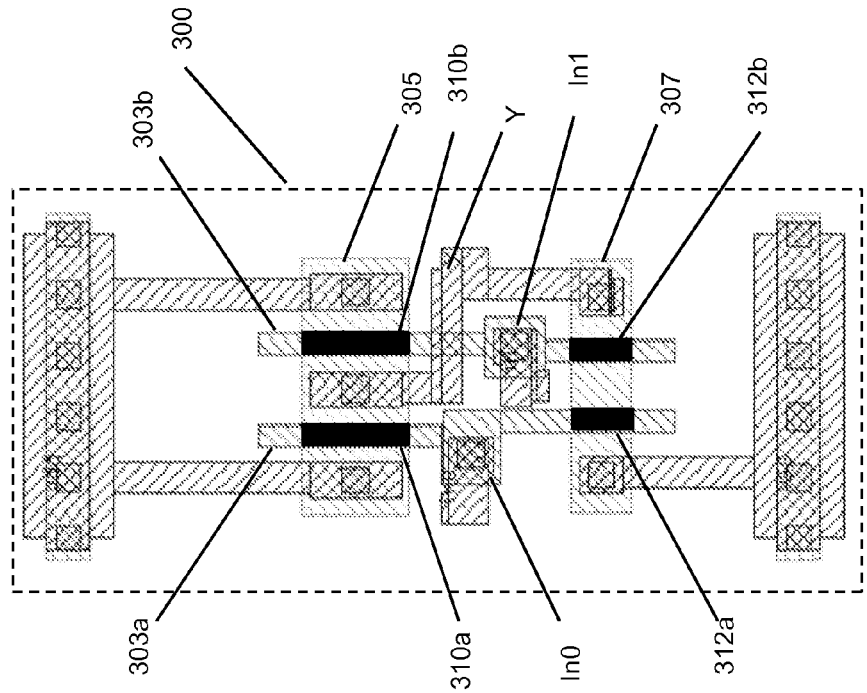
FIG. 3A and FIG. 3B illustrate respective planar views of an example of a semiconductor device layout diagram for a two-input NAND functional cell.
Figure 3A:
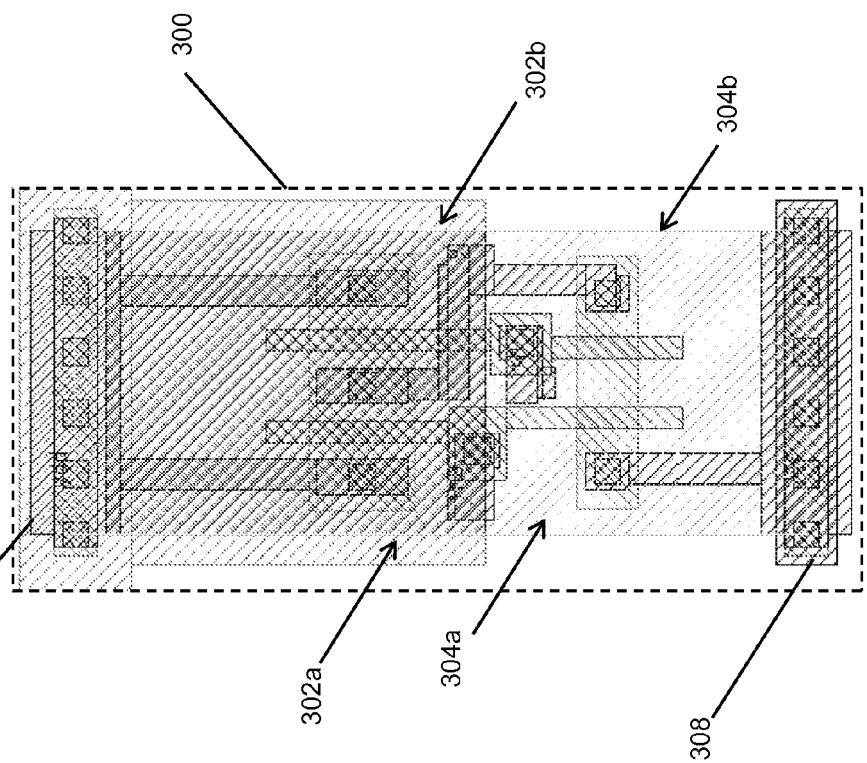

FIG. 3A and FIG. 3B illustrate respective planar views of an example of a semiconductor device layout diagram for a CMOS implementation of a two-input NAND functional cell 300. FIG. 3A illustrates all layers of the semiconductor device shown as transparent to allow for viewing of lower overlapping layers. An outer rectangular dashed line defines an area 301 bounding the two-input NAND functional cell 300. In such a planar view, the internal components or elements of the functional cell 300 are contained within the cell boundary 301. Such devices typically include one or more metal layers forming a power grid for distributing voltages and/or currents from one or more power supplies (not shown). In the illustrative example, layer 306 is a metal power layer (e.g., Vdd); whereas, layer 308 is a metal layer forming another power grid (e.g., Vss) that may be an electrical ground reference for circuit elements of the semiconductor device. The metal layers 306, 308 may be on the same physical layer of the semiconductor device or on different layers, as long as the two layers 306, 308 do not touch or otherwise short circuit the power supply. Either or both layers 306, 308 may be on the same or different layers with circuitry (e.g., wire interconnects).

Input transistor devices 302 are defined within the semiconductor material, including suitably positioned conducting terminals together forming transistors, diodes, and the like. In the particular example of the two-input CMOS NAND cell, the cell 300 includes two PMOS transistors 302a, 302b (generally 302) and two NMOS transistors 304a, 304b (generally 304).

FIG. 3B illustrates a planar view of the same semiconductor device layout with some of the layers removed for better illustration of the junctions. The device includes a first input In0 interconnected to a first polysilicon gate 303a, and a second input In1 interconnected to a second polysilicon gate 303b. Each of the gates 303a, 303b extends over an N-type diffusion layer 305 for the PMOS transistors 302 and over an P-type diffusion layer 307 for the NMOS transistors 304. Namely, each of the two PMOS transistor devices 302 (FIG. 3A) includes a respective junction 310a, 310b formed by overlap of a respective one of the polysilicon gates 303a, 303b and the N-type diffusion layer 305. Likewise, each of the two NMOS transistor devices 304 (FIG. 3A) includes a respective junction 312a, 312b formed by overlap of a respective one of the polysilicon gates 303a, 303b and the P-type diffusion layer 307. The darkened regions of the junctions 310a, 310b, 312a, 312b represent the areas of the respective transistor gate.

The cell layout details illustrated in FIG. 3A or FIG. 3B are not necessarily what would be observable by the EBIC/OBIC techniques described herein. By such techniques; however, it would be possible to determine which transistors of a give functional cell are ON and which are OFF. Images obtained by such techniques can, in some instances, include other details besides active transistors. For example, junctions at boundaries of isolation wells may also be observable.

FIG. 4A through FIG. 4D illustrate respective junction layout images for the functional cell 300 illustrated in FIG. 3A and FIG. 3B, under different stimulus conditions. Such images can be obtained by scanning a semiconductor device with a radiation source as described herein, while the device is operated. The junctions under a suitable bias will produce an electric field causing the electron-hole pairs induced by the radiation to produce a measurable current. Suitably biased junctions can thus be identified and associated with a surface location of the device. With a sufficient number of such surface locations identified, an image of the suitably biased junctions can be formed. For example, in some embodiments, each location scanned can correspond to a pixel. The pixels can be defined, generally, by a region of radiation (e.g., a surface region or spot in which some level of radiation is contained). As different pixels are scanned and determinations reached whether they correspond to a suitably biased junction or not, a junction layout picture of the device can be formed. In the illustrative example, the darkened or shaded rectangles result from identification of one or more such pixels. As shown, the resolution of sufficient to distinguish some junctions by their dimensions. In this example, the PMOS junctions have a first length $L_1$ and width W; whereas, the NMOS junctions have a different (i.e., shorter) length $L_2$.

Dashed rectangles represent the physical locations of the junctions 310a, 310b, 312a, 312b of the example functional cell 300. Junctions that are biased to be conducting (e.g., "ON") are shaded in. Thus, referring to FIG. 4A, both junctions 310a, 310b of the PMOS transistors 302 (FIG. 3A) are biased corresponding to logical low levels (e.g., 0,0). The two inputs would be low for the give cell 300, such that junctions 310a, 310b of the PMOS transistors 302 conduct and the junctions 312a, 312b of the NMOS transistors 304 do not. A conductive path will be established between the output Y and Vdd through the conducting junctions 310a, 310b, bringing the output high (e.g., logical 1).

Cell identification depends upon particulars of a semiconductor device, such as its underlying technology and other aspects of its design and/or fabrication, such as its associated library. With no two functional cells having exactly the same signature determined by its junction location, the functional cells can be identified. Thus, one or more such features as junction size, number, location relative to layout of the particular function cell and orientation can be used to determine an identity of the particular cell. In the illustrative example, it is evident that at least two of the four junctions are suitably biased (e.g., by logical "0") to produce detections of variations in power supply voltages and/or currents leading to the darkened regions shown. Thus, depending upon other functional cell members of the database, it may be possible to identify the functional cell 300 as a two-input NAND function from a single observation (i.e., scan of the functional cell) under any one of the possible input configurations. Upon such identification, it is possible to infer the location, size, etc., of the other junctions by association with a known or otherwise predetermined functional cell, which allows for identification of gates by dashed lines that are not suitably biased.

In particular, FIG. 4B illustrates the two-input NAND functional cell 300 with one of the inputs to be low and another to be high. For the example device 300 under such stimulus, junction 310a of the first PMOS transistor 302a is biased to be conducting, corresponding to a logical 0 (e.g., ON) and the other junction 310b of the second PMOS transistor 302b is biased to be non-conducting corresponding to a logical 1 (e.g., "OFF"). Additionally, the junction 312a of the first NMOS transistor 304a is OFF, while the junction 312b of the second NMOS transistor 304b is ON. A conductive path will be established between the output Y and Vdd through the conducting junctions 310a bringing the output high (e.g., logical 1). It is possible to infer the other transistor junction is biased corresponding to a logical high level, since it would not be visible in such a state under the EBIC/OBIC techniques described herein. Such an inference would be trivial once the junction layout of the cell 300 has been matched to a functional device (e.g., two-input NAND), such that the input can be identified as 0,1. Under such input conditions, it can be determined with knowledge of the functional cell (e.g., NAND) that the output Y would be a logical 1. A functional truth table can be configured from observations of the same functional cell 300 under different stimulus, and in this instance, all possible input stimulus configurations. Thus, FIG. 4C illustrates the observable junction configuration for a 0,1 input. Once again, the output Y would be a logical 1. Similarly, FIG. 4D illustrates the observable junction configurations for a 1,1 input. With such a stimulus, junctions 312a, 312b of both NMOS transistors 304a, 304b are conducting, while neither of the junctions 310a, 310b of the PMOS transistors 302a, 302b are conducting. Accordingly, the output Y is brought low to Vss (e.g., ground) representing a logical 0. The resulting truth table is shown in Table 1 below.

TABLE 1

Functional Table for 2-Input NAND

| In0 | In1 | Output (Y) |
|-----|-----|------------|
| 0 | 0 | 1 |
| 0 | 1 | 1 |
| 1 | 0 | 1 |
| 1 | 1 | 0 |

In at least some embodiments, all possible inputs are provided to a functional cell to ensure that all of the junctions (i.e., gates) of the cell are exercised (i.e., conducting) to be observable by the techniques described herein at least once during the stimulation. The illustrations of FIG. 4A through FIG. 4D demonstrate such an approach for the two-input NAND cell. The locations of each gate determined when conducting can be recorded and stored in the same association (e.g., file and/or image), such that at the conclusion of stimulation, the locations of all gates are known for the particular cell. The blackened areas (i.e., rectangles) of the device of FIG. 3B can represent the results of such an analysis. The resulting pattern, in this instance, the four rectangles, can be associated with a particular cell (e.g., a two-input NAND) of a library of standard cells by pattern matching. Such pattern generation and matching can be repeated for all such cells of a given semiconductor device.

Typically, functional cells are unique enough that in most instances, there would be no need to rely on having to exercise every transistor in a manner to turn every junction ON in order to determine the cell type. Such patter recognitions to functional cells of the cell library can be made reliably on a subset of all the junctions. If it is determined that more detail is necessary to distinguish between multiple possible matches, then additional input stimuli can be provided to exercise more transistors, turning on more junctions until a reliable match can be made. Preferably, patter matching is accomplished with having identified fewer than all of the junctions to reduce analysis time required to infer a netlist.

Figure 5:
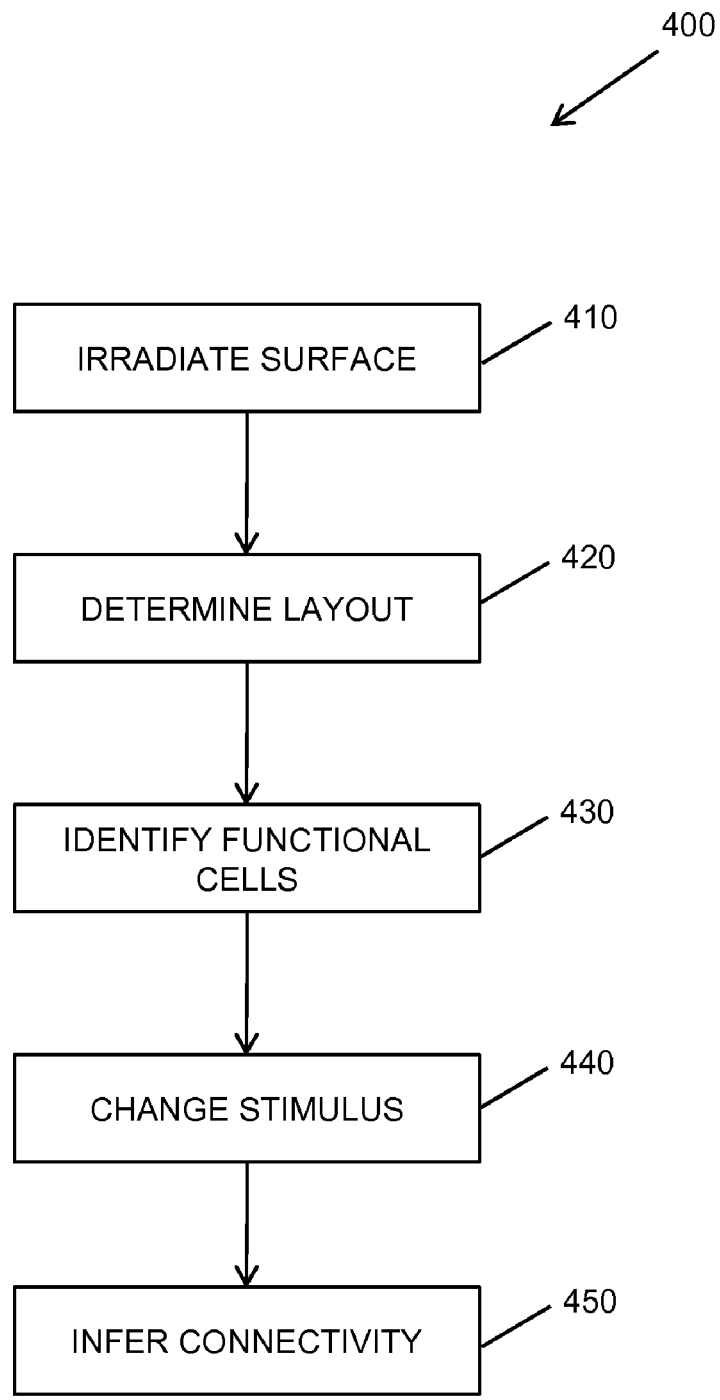
FIG. 5 illustrates a flowchart detailing an example operation of a particular embodiment of a process for determining functionality of an unknown semiconductor device.

FIG. 5 illustrates a flowchart detailing an example operation of a particular embodiment of a process 400 for determining functionality of an unknown semiconductor device. A surface of the semiconductor device is irradiated at 410. The radiation source illuminates a region sufficiently small to distinguish the smallest junction to be identified. The source of radiation can be electromagnetic radiation, such as provided by a laser. Alternatively or in addition, the radiation can be from an electron beam source. In at least some embodiments, the illuminated region can be scanned or otherwise repositioned with respect to a surface of the device, such that multiple junctions contained therein can be individually and independently illuminated. In at least some embodiments, scanning or repositioning is sufficient to allow substantially all of the junctions of the device to be individually irradiated.

A layout of at least some of the plurality of semiconductor junctions is determined at 420 responsive to the irradiation. For those junctions identified during irradiation of the device, junction configurations are identified with respect to respective positions in or on the device. Configuration information may contain one or more of junction position (e.g., x-y location along a surface of the device), junction size (e.g., length, width, area), and orientation (e.g., horizontal, vertical).

Groupings of at least some of the plurality of semiconductor junctions are identified within the determined layout at 430. Each grouping is indicative of a respective functional cell of a number of predetermined functional cells. Thus, having determined a layout of those physical junctions detected during the irradiation process, it is possible to compare groupings of such junctions to junction configurations and/or functionality of predetermined functional cells. For example, semiconductor device manufacturers, such as, provide libraries of functional cell devices, usable to associate junction configurations of groupings of junctions to library of such groupings.

Semiconductor foundries create standard cell libraries. Particular layout data may not necessarily be provided in such libraries, but may be obtainable by other means. For example, the foundries may provide such data upon request. Alternatively or in addition, such layout information could be confirmed by other independent approaches. For example, at least one of each of the different functional cells of a given standard cell library can be identified and observed under a high-power microscope (e.g., by a scanning electron microscope). Such physical observation of each cell would provide insight into the underlying layout. Layouts determined by such an approach could then be associated with a respective functional cell. It is conceivable that more than one layout may associated with a single standard cell. If so, then the process would be repeated for each different layout until the library is complete.

Once a likely grouping is identified, it can be associated with a candidate functional cell. If it is determined that more than one candidate functional cells can be identified with the same configuration of junctions, the particular functional cell can be identified according to logical function of the gate. See, for example, the various junction configurations of FIG. 4A through FIG. 4D, and Table 1. Such determination may require multiple scans under different input stimuli. At conclusion of functional cell identification, the particular functional cells are known, along with, perhaps, their location and orientation within the semiconductor device. For a logical view, an image can be prepared by replacing the groupings of junction configurations with their respective logical function. Generally, the functional cells will not be interconnected at this time.

Interconnection of the functional cells can be inferred through repeated identification of the junctions under different stimulus conditions. It is important to distinguish that identification of the junction as described herein can be accomplished while the device is functioning. Namely, the device is operated under power and with suitable stimuli applied at externally accessible contacts. Such stimuli can be referred to as test vectors (e.g., a string of 1s and 0s corresponding to electrical input values applied to suitable ones of the externally accessible contacts (e.g., signal contacts). Stimuli to at least one of the multiple externally accessible contacts are changed at 440. Such change can include a variation in one or more digits in the test vector. Such changes can be accomplished sequentially for a determined series of test vector stimuli. Connectivity of one or more of the plurality of interconnected functional cells is inferred at 450 in response to the changed stimulus as will be described further below.

Figure 6:
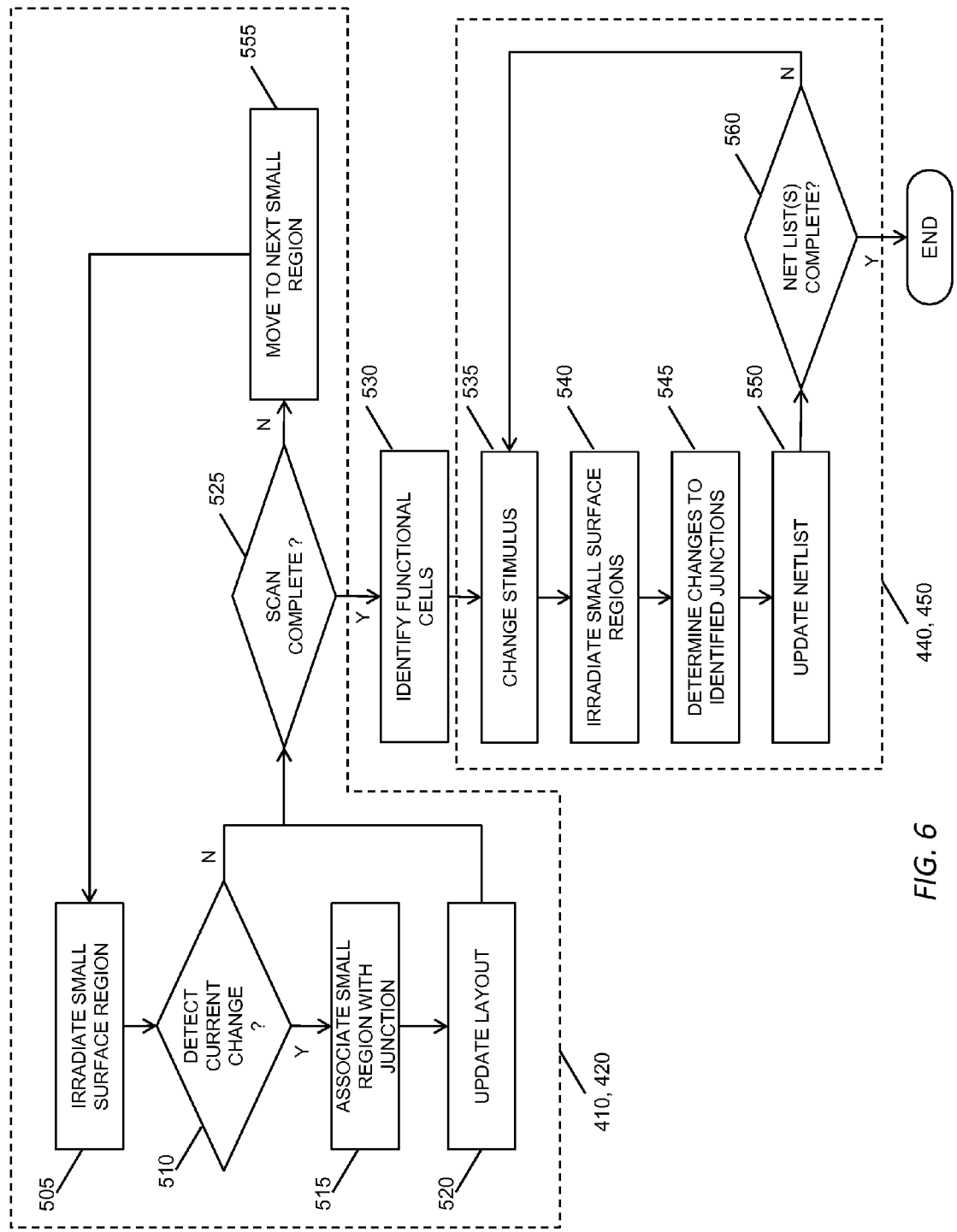
FIG. 6 illustrates a more detailed flowchart detailing an example operation of a particular embodiment of a process for determining functionality of an unknown semiconductor device.

FIG. 6 illustrates a more detailed flowchart detailing an example operation of a particular embodiment of a process for determining functionality of an unknown semiconductor device. A small region of a surface of a semiconductor device is irradiated at 505. For example, a laser or an electron beam is directed at a supporting surface (i.e., a "back side") of the semiconductor device. In at least some embodiments, a portion of the supporting layer is removed by a thinning process that may include one or more of grinding and etching (e.g., thinned from 150 micron to about 50 micron to facilitate electron-hole generation from applied radiation). An electrical current of a power supply powering junctions of the semiconductor device is monitored during the irradiation at 510. Such monitoring can be accomplished, for example, using the pico-ammeter 206 (FIG. 2). If no change in current id detected, a determination is made as to whether a scan of the device is complete at 525. If not, the irradiation source is directed to another, different small region at 525. The process continues until a scan of the semiconductor device is completed (e.g., after substantially the entire active surface of the semiconductor device has been scanned).

If a change in current is detected, the irradiated region is associated with a junction at 515. For example, on a surface region of the device defining an x-y plane, the location of a junction is associated with a particular x-y coordinate (i.e., $x_1$, $y_1$). A layout (e.g., table and/or graphical image) tracking location of such junctions is updated at 520 to account for a junction at the small region ($x_1$, $y_1$).

After it has been determined that the scan is complete at 525 (e.g., substantially the entire active surface of the semiconductor device has been scanned), the process continues to identify functional cells at 530. Such functional cell identification can be accomplished as defined in relation to FIG. 5 above. For example, junctions can be grouped and compared to possible functional cells predefined in a library of the same. Upon determination of substantially all of the functional cells of the semiconductor device under analysis, stimuli to the semiconductor device are changed at 530. Once again, detection of junctions yielding a revised layout indicative of the revised configuration and ultimately functional devices is preferably accomplished under functional operation of the semiconductor device.

After changing in the stimulus, small surface region of the semiconductor device is irradiated at 540. In some embodiments, the irradiation proceeds as described in relation to irradiation at 505 (e.g., substantially the entire functional surface of the semiconductor device is irradiated). Alternatively or in addition, surface irradiation is carried out for a subset of the surface corresponding to at least some of the previously identified junctions, or junctions inferred from determination of the functional cells (e.g., one small surface region, such as a pixel, in each identified or inferred junction). Such reduction in scan area can be valuable in reducing scan times. Such reduced scan may be sufficient to determine a bias of the junction.

Changes to such irradiate junctions are determined at 545. For example, a previously identified junction indicative of a suitable bias may subsequently be non-detectable upon re-scanning after application of the changed stimulus at 535, e.g., change from 0 to 1. Similarly, a previously non-detected junction (that may have been inferred from identification of a functional cell) may be detectable upon re-scanning. Inferences as to connectivity of the functional cells can be made according to such changes in state. A netlist recording interconnections of functional cells is updated at 550, as required, in response to analysis of input stimuli and changes to states of junctions. The process continues in a like manner until a netlist is sufficiently complete, as determined at 560. Such completion can be determined by a suitable measure, such as determination interconnectivity of a predetermined logic level (e.g., third level). Alternatively of in addition, another measure for determining completion may be inferring interconnects for all or some predetermined value less than all of the functional cells. If the netlist is not sufficiently complete, the stimulus is changed and the process repeated as required.

Figure 7A:
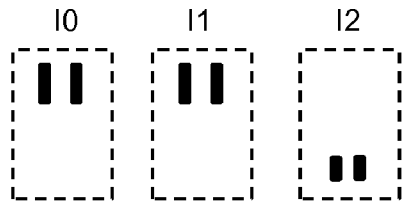
FIG. 7A through FIG. 7E illustrate respective junction layout images for an example functional cell under different stimuli.
Figure 7B:
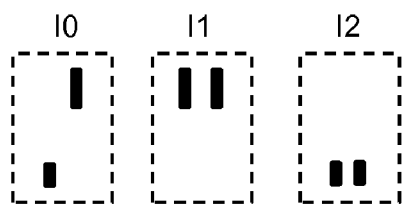
Figure 7C:
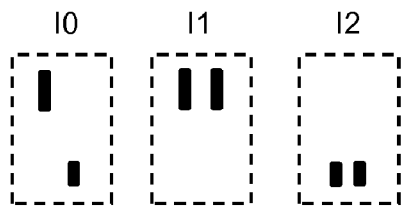
Figure 7D:
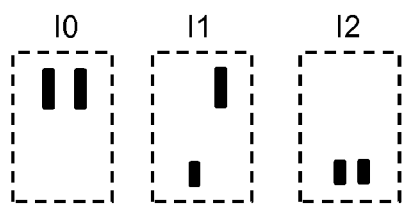
Figure 7E:
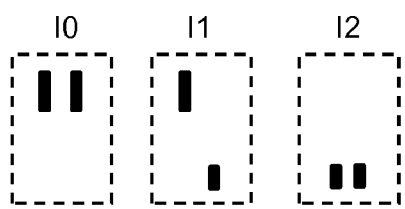
Figure 8A:
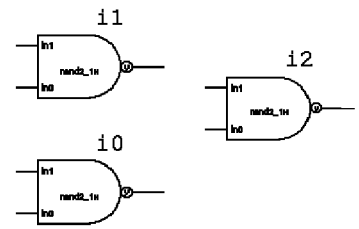
FIG. 8A through FIG. 8E illustrate inferred connectivity of the functional cells in response to the different stimulus conditions responsible for the junction layout images of FIG. 7A through FIG. 7E.

FIG. 7A through FIG. 7E illustrate respective junction layout images for an example functional cell under different stimulus conditions. FIG. 7A illustrates configuration of six junctions suitably biased for detection by the processes described herein. These junctions may represent results obtained from scanning a portion of a semiconductor surface. In more detail, the six junctions are grouped as shown, with two junctions associated with each of three different functional cells: I0; I1; and I2. The large dashed rectangles represent an area of the semiconductor device bounding each respective functional cell. In the particular example, the identified configuration of junctions suggests that each of the functional cells is a two-input NAND device. FIG. 8A illustrates a logical view of the three functional cells illustrated without any interconnections shown—no nets completed yet.

The configuration of conducting and non-conducting junctions was observed for an input stimulus test vector of "0000" applied to device input pins A, B, C, and D, respectively. (See, for example, FIG. 1). Since the configuration of the junctions of functional cells I0 and I1 suggest both are driven with an input 0,0, it is possible from the junction configuration observed and illustrated in FIG. 7A that all four inputs are driven by one or more input pins; although, it is too soon to infer this with any degree of certainty without further analysis. It is not possible for the inputs of the third functional cell I2 to be driven by an input pin, since the inputs are "1" as determined by bias of the respective junctions. Accordingly, the partial netlist illustrated in FIG. 8A places the first two cells to the left of the third cell—closer to input pins of a logical cell.

Figure 8B:
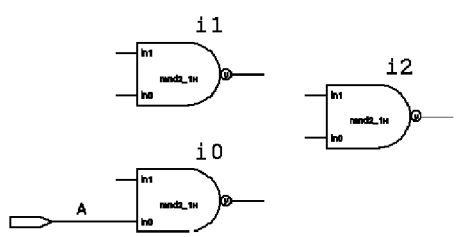

In an effort to infer interconnections, an input stimulus is changed. One such approach is referred to as a "walking one." With such an approach, one of the inputs is driven to a "1". Namely, input A is driven to a 1 with the rest remaining at 0 for an input test vector of 1000. FIG. 7B illustrates configuration of same six junctions obtained by a subsequent scan. Notably, one input (i.e., "In0") of the first cell I0 has changed state from a 0 to a 1 as can be determined from observation of the configuration of the conducting and non-conducting junctions. The remaining inputs of the other two cells I1 and I2 remain unchanged. It can also be inferred that an output "y" of the first cell I0 changes state from a 1 to a 0, consistent with the logical truth table for a two-input NAND with input 1,0. Thus, it can be inferred that the first input In0 of the first cell I0 is connected to input pin A. FIG. 8B captures the inferred interconnection drawn from input pin A to input In0 of cell I0.

Figure 8C:
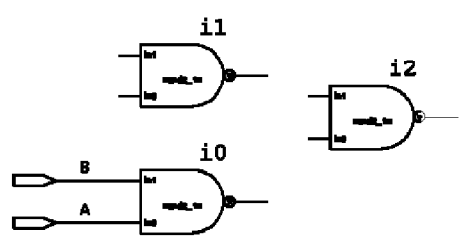

A further subsequent input vector in the "walking ones" approach is represented by 0100. Thus, the logical 1 has moved from input pin A to input pin B. Once again, the configuration of the same six junctions is obtained by a subsequent scan, the results of which are illustrated in FIG. 7C. Notably, the second input (i.e., "In1") of the first cell I0 has changed state from a 0 to a 1, while the first input In0 has returned to a 0, as determined from observation of the configuration of the conducting and non-conducting junctions. The other inputs of the other two cells I1 and I2 remain unchanged. It can be inferred that the "y" output remains at 0 as would be proper for the two-input NAND with input 0,1. Thus, it can be inferred that the second input In1 of the first cell I0 is connected to input pin B. FIG. 8C captures the inferred interconnection drawn from input pin B to input In1 of cell I0.

Figure 8D:
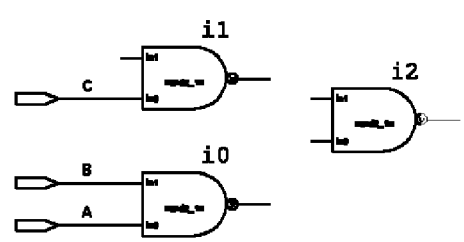
Figure 8E:
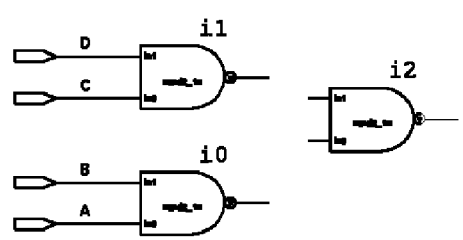

The walking ones approach continues with a 1 at input pin C, with all other pins at 0 for an input test vector 0010. FIG. 7D illustrates an observed configuration of the junctions under this input stimulus. It can be determined from observation of the configuration of the conducting and non-conducting junctions that the first input In0 of the second cell I1 has transitioned to a 1, which leads to a corresponding change in output from a 1 to a 0 as would be expected for a two-input NAND cell with an input 1,0. Thus, it can be inferred that the first input In0 of the second cell I1 is connected to input pin C. FIG. 8D captures the inferred interconnection drawn from input pin C to input In0 of cell I1. Likewise, with an input test vector 0001, the observed junctions illustrated in FIG. 7E suggest an input of 0,1, leading to the inference that the second input In1 of the second gate I1 is connected to input pin D as illustrated in FIG. 8E.

The first and second cells I0, I1 are referred to as first-level logic cells, since they are connected to input pins without any intervening functional cells. Inputs for second-level logic cells may be driven by the outputs of first-level cells. Having inferred connectivity and developed a suitable schematic and/or netlist to capture connectivity of input pins to the first-level cells, it is possible to construct additional test vectors to extend an approach, as with the walking ones, to the second level, allowing extension of the netlist to the second-level devices to be determined. More generally, subsequent logic levels may be driven by the outputs of lower-level logic cells. The depth of logic levels does not extend indefinitely despite the possibility of millions of transistors. The number of levels is generally determined according to timing requirements of the circuitry.

To address inner levels (e.g., second tier, third tier) not necessarily directly connected to externally accessible contacts, it is possible to control logic values on such "nets" using techniques well established in functional device testing. For example, formal methods can be used to control a logic value on an inner-tier net for which all interconnects are known backwards through all of the driving gates of the net. With such formal methods, external inputs can be constructed to control logic values of the net, thereby stimulating the driven, inner-tier functional cell through with all possible inputs. For instance, in a Boolean logic equivalence checker, such as the CADENCE® CONFORMAL® system, any net can be compared to a constant "0" or constant "1" and the system will provide a counter-case, that is the test vector that will show the net can be a value other than the constant then being compared to.

Any controller (e.g., implanting software) should include a formal proof engine such as found in a Boolean logic equivalence checker to create test vectors. In at least some embodiments, the controller (e.g., computer program) can operate to minimize the number of test vectors necessary to stimulate the nets in a manner to identify the underlying gates of a give device(s). A simple approach suggests two vectors for every net. It is apparent, however, in the example of FIGS. 7A through 7E, that there are four nets (i.e., A, B, C, D) and only 5 test vectors—less than the 4×2=8 predicted by the simple approach. Also, some of the reduced vector set can be used to infer interconnects at a subsequent level. In the illustrative example, only two additional vectors are required to determine interconnects to the second-tier devices, resulting in a total of 7 test vectors instead of 12 (8+2×2). Similar approaches can be extended to other nets and other devices.

For latches (e.g., flip-flops), input vectors can be set up as described above, then latched through according to the features of the particular latches. For other devices, such as adders, half-adders, etc., are combinational circuits, defined by nets of lower-level functional cells that would otherwise be identifiable by the techniques described herein.

Although the term "unknown" is used herein in reference to the semiconductor device under analysis, some or all aspects underlying the design and/or fabrication of the device may actually be known. For example, in a scenario in which the process is undertaken to confirm fabrication, "unknown" suggests a lack of a priori knowledge of the actual implementation of the semiconductor device. Even though such insight into the particular configuration of the functional cells and their interconnection may not be known beforehand, at least some details are known or otherwise discoverable, such as the device technology and/or the appropriate library of standard cells in which to search.

One or more of the various modules describe herein, such as the central processor 212 and the radiation source controller 210 may represent or include any form of processing component, including general purpose computers, dedicated microprocessors, or other processing devices capable of processing electronic information. Examples of processors include digital signal processors (DSPs), application-specific integrated circuits (ASICs), field-programmable gate arrays (FPGAs), and any other suitable specific- or general-purpose processors. Although the examples described herein relate to particular embodiments of the modules, each module may include a respective processing component, or more generally, any suitable number of processors.

Any of the modules may include memories (e.g., memory 218), for example, storing related processing values and or instructions. Any such memories may include any collection and arrangement of volatile or non-volatile components suitable for storing data. For example, any such memories may include random access memory (RAM) devices, read-only memory (ROM) devices, magnetic storage devices, optical storage devices, or any other suitable data storage devices. In particular embodiments, any such memories may represent, in part, computer-readable storage media on which computer instructions and/or logic are encoded. In such embodiments, some or all the described functionality of the various modules, e.g., the jitter error measurement modules, timing error detection modules, and error correction modules may be provided by a processor (not shown) executing the instructions encoded on the described media.

In general, each of the modules, e.g., user interface 220, central processor 212, radiation source controller 210, and test generator 214, may represent any appropriate combination of hardware and/or software suitable to provide the described functionality. Additionally, any two or more of the modules may represent or include common elements.

The above-described systems and processes can be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

Method steps can be performed by one or more programmable processors executing a computer program to perform functions of the invention by operating on input data and generating output. Method steps can also be performed by and an apparatus can be implemented as special purpose logic circuitry. The circuitry can, for example, be a FPGA (field programmable gate array) and/or an ASIC (application-specific integrated circuit). Modules, subroutines, and software agents can refer to portions of the computer program, the processor, the special circuitry, software, and/or hardware that implement that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can include, can be operatively coupled to receive data from and/or transfer data to one or more mass storage devices for storing data (e.g., magnetic, magneto-optical disks, or optical disks).

Data transmission and instructions can also occur over a communications network. Information carriers suitable for embodying computer program instructions and data include all forms of non-volatile memory, including by way of example semiconductor memory devices. The information carriers can, for example, be EPROM, EEPROM, flash memory devices, magnetic disks, internal hard disks, removable disks, magneto-optical disks, CD-ROM, and/or DVD-ROM disks. The processor and the memory can be supplemented by, and/or incorporated in special purpose logic circuitry.

To provide for interaction with a user, the above described techniques can be implemented on a computing device having a display device (e.g., as part of the user interface 220). The display device can, for example, be a cathode ray tube (CRT) and/or a liquid crystal display (LCD) monitor, and/or a light emitting diode (LED) monitor. The interaction with a user can, for example, be a display of information to the user and a keyboard and a pointing device (e.g., a mouse or a trackball) by which the user can provide input to the computing device (e.g., interact with a user interface element). Other kinds of devices can be used to provide for interaction with a user. Other devices can, for example, be feedback provided to the user in any form of sensory feedback (e.g., visual feedback, auditory feedback, or tactile feedback). Input from the user can, for example, be received in any form, including acoustic, speech, and/or tactile input.

The above described techniques can be implemented in a distributed computing system that includes a back-end component. The back-end component can, for example, be a data server, a middleware component, and/or an application server. The above described techniques can be implemented in a distributing computing system that includes a front-end component. The front-end component can, for example, be a client computing device having a graphical user interface, a Web browser through which a user can interact with an example implementation, and/or other graphical user interfaces for a transmitting device. The components of the system can be interconnected by any form or medium of digital data communication (e.g., a communication network). Examples of communication networks include a local area network (LAN), a wide area network (WAN), the Internet, wired networks, and/or wireless networks.

The system can include clients and servers. A client and a server are generally remote from each other and typically interact through a communication network. The relationship of client and server arises by virtue of computer programs running on the respective computing devices and having a client-server relationship to each other.

Communication networks can include packet-based networks, which can include, for example, the Internet, a carrier internet protocol (IP) network (e.g., local area network (LAN), wide area network (WAN), campus area network (CAN), metropolitan area network (MAN), home area network (HAN)), a private IP network, an IP private branch exchange (IPBX), a wireless network (e.g., radio access network (RAN), 802.11 network, 802.16 network, general packet radio service (GPRS) network, HiperLAN), and/or other packet-based networks. Circuit-based networks can include, for example, the public switched telephone network (PSTN), a private branch exchange (PBX), a wireless network (e.g., RAN, bluetooth, code-division multiple access (CDMA) network, time division multiple access (TDMA) network, global system for mobile communications (GSM) network), and/or other circuit-based networks.

The computing device can include, for example, a computer, a computer with a browser device, a telephone, an IP phone, a mobile device (e.g., cellular phone, personal digital assistant (PDA) device, laptop computer, electronic mail device), and/or other communication devices. The browser device includes, for example, a computer (e.g., desktop computer, laptop computer) with a World Wide Web browser (e.g., Microsoft® Internet Explorer® available from Microsoft Corporation, Mozilla® Firefox available from Mozilla Corporation). The mobile computing device includes, for example, a Blackberry®.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for determining functionality of a semiconductor device comprising a plurality of semiconductor junctions in electrical communication with at least one power supply, the semiconductor junctions grouped into a plurality of interconnected functional cells, and the device also including a plurality of externally accessible contacts in electrical communication with at least some of the plurality of semiconductor junctions, the method comprising:
   irradiating a surface of the semiconductor device;
   determining a layout of at least some of the plurality of semiconductor junctions responsive to the irradiation;
   identifying within the determined layout, groupings of at least some of the plurality of semiconductor junctions, each grouping indicative of a respective functional cell of a plurality of predetermined functional cells;
   changing a stimulus to at least one of the plurality of externally accessible contacts; and
   inferring connectivity of one or more of the plurality of interconnected functional cells in response to the changed stimulus.

2. The method of claim 1, wherein the act of irradiating comprises:
   irradiating a relatively small region of the surface of the semiconductor device; and
   scanning the irradiated region across at least a portion of the surface of the semiconductor device.

3. The method of claim 2, wherein the act of irradiating the relatively small region of the surface of the semiconductor comprises illuminating with laser radiation.

4. The method of claim 2, wherein the act of irradiating the relatively small region of the surface of the semiconductor comprises illuminating with an electron beam.

5. The method of claim 2, wherein determining a layout comprises:
   detecting, during scanning, changes in at least one of a current and a voltage of the at least one power supply; and
   associating the relatively small region of the surface of the semiconductor being irradiated with a respective one of the plurality of semiconductor junctions.

6. The method of claim 5, further comprising generating a planar image of the relatively small surface regions associated with the plurality of semiconductor junctions, the image being indicative of the determined representative layout of at least some of the plurality of semiconductor junctions viewed from the surface of the semiconductor device.

7. The method of claim 1, further comprising thinning a supporting layer of the semiconductor device and irradiating an exposed surface of the thinned supporting layer.

8. The method of claim 1, wherein identifying the respective predetermined functional cell comprises comparing the respective grouping of at least some of the plurality of semiconductor junctions to a library of predetermined functional cells.

9. The method of claim 1, further comprising identifying which of the plurality of interconnected functional cells undergoes a state change in response to the stimulus change.

10. The method of claim 1, further comprising determining how at least a subset of the plurality of interconnected functional cells are actually interconnected based on the identified state changes of the subset of the plurality of interconnected functional cells.

11. A computer program product, tangibly embodied in an information carrier, the computer program product including instructions being operable to cause a semiconductor device tester to:
   determine a layout of at least some of the plurality of semiconductor junctions of a semiconductor device responsive to changes in at least one of a voltage and a current of a power supply interconnected to the plurality of semiconductor junctions, the changes responsive to irradiation of a surface of the semiconductor device;
   identify within the determined layout, groupings of at least some of the plurality of semiconductor junctions, each grouping indicative of a respective functional cell of a plurality of predetermined functional cells;
   change a stimulus to at least one of a plurality of externally accessible contacts of the semiconductor device, at least some of the plurality of externally accessible contacts in electrical communication with one or more of the predetermined functional cells; and infer connectivity of one or more of the plurality of interconnected functional cells in response to the changed stimulus.

12. The computer program product of claim 11, wherein determination of the layout comprises:

detection of changes in at least one of the voltage and the current of the at least one power supply during scanning of a surface of the semiconductor device by an irradiation source adapted to irradiate a relatively small region of the surface; and association of the respective relatively small surface region being scanned upon detection of such changes with a respective one of the plurality of semiconductor junctions.

13. The computer program product of claim 12, comprising further instructions being operable to generate a planar image of the relatively small surface regions, the image being indicative of the determined representative layout of at least some of the plurality of semiconductor junctions viewed from the surface of the semiconductor device.

14. The computer program product of claim 11, wherein identification of the respective predetermined functional cell comprises comparison of the respective grouping of at least some of the plurality of semiconductor junctions to a library of predetermined functional cells.

15. The computer program product of claim 11, comprising further instructions being operable to identify of which of the plurality of interconnected functional cells undergoes a state change in response to the stimulus change.

16. The computer program product of claim 15, comprising further instructions being operable to determine how at least a subset of the plurality of interconnected functional cells are actually interconnected based on the identified state changes of the subset of the plurality of interconnected functional cells.

17. An apparatus for determining functionality of a semiconductor device, comprising:

means for irradiating a surface of the semiconductor device, the semiconductor device comprising a plurality of semiconductor junctions in electrical communication with at least one power supply, the semiconductor junctions grouped into a plurality of interconnected functional cells, and the semiconductor device also including a plurality of externally accessible contacts in electrical communication with at least some of the plurality of semiconductor junctions;

means for determining a layout of at least some of the plurality of semiconductor junctions responsive to the irradiation;

means for identifying within the determined layout, groupings of at least some of the plurality of semiconductor junctions, each grouping indicative of a respective functional cell of a plurality of predetermined functional cells;

means for changing a stimulus to at least one of the plurality of externally accessible contacts; and means for inferring connectivity of one or more of the plurality of interconnected functional cells in response to the changed stimulus.

* * * * *